(12) United States Patent
Shono

(10) Patent No.: US 9,601,481 B2
(45) Date of Patent: Mar. 21, 2017

(54) SEMICONDUCTOR DEVICE

(71) Applicant: KABUSHIKI KAISHA TOSHIBA, Tokyo (JP)

(72) Inventor: Toru Shono, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/635,299

(22) Filed: Mar. 2, 2015

(65) Prior Publication Data

US 2016/0079232 A1 Mar. 17, 2016

(30) Foreign Application Priority Data

Sep. 11, 2014 (JP) .................................. 2014-185530

(51) Int. Cl.
| | |
|---|---|
| *H01L 27/02* | (2006.01) |
| *H01L 27/06* | (2006.01) |
| *H01L 27/08* | (2006.01) |
| *H01L 29/866* | (2006.01) |
| *H01L 29/06* | (2006.01) |
| *H01L 29/417* | (2006.01) |
| *H01L 29/78* | (2006.01) |

(Continued)

(52) U.S. Cl.
CPC ...... *H01L 27/0296* (2013.01); *H01L 27/0255* (2013.01); *H01L 27/0629* (2013.01); *H01L 29/0649* (2013.01); *H01L 29/0684* (2013.01); *H01L 29/417* (2013.01); *H01L 29/7813* (2013.01); *H01L 29/866* (2013.01); *H01L 27/0814* (2013.01); *H01L 29/1608* (2013.01); *H01L 29/20* (2013.01)

(58) Field of Classification Search
USPC ........................................................ 257/356
See application file for complete search history.

(56) References Cited

U.S. PATENT DOCUMENTS 7,348,652 B2 * 3/2008 Beigel ................ H01L 27/0629
257/499
7,859,083 B2 12/2010 Nishimura et al.
(Continued)

FOREIGN PATENT DOCUMENTS

| JP | 2005235844 A | 9/2005 |
|---|---|---|
| JP | 5309497 B2 | 10/2013 |

*Primary Examiner* — Thao P Le
(74) *Attorney, Agent, or Firm* — Patterson & Sheridan, LLP

(57) ABSTRACT

A semiconductor device includes a first electrode, a first semiconductor layer of a first dopant type on the first electrode. A first region of the semiconductor device includes a second semiconductor layer of the second dopant type on the first semiconductor layer, a third semiconductor layer of the first dopant type on the second semiconductor layer, and a second electrode extending though the second and third semiconductor layers and inwardly of the first semiconductor layer. A second region of the semiconductor device includes an insulating layer over the first semiconductor layer, a fourth semiconductor layer of the first or second dopant type on the insulating layer, a fifth semiconductor layer of a different dopant type on the insulating layer and surrounding the fourth semiconductor layer, and a sixth semiconductor layer of the same dopant type on the insulation layer and surrounding the fifth semiconductor layer.

8 Claims, 8 Drawing Sheets

(51) Int. Cl.
*H01L 29/16* (2006.01)
*H01L 29/20* (2006.01)

(56) References Cited

U.S. PATENT DOCUMENTS

| | | | |
|---|---|---|---|
| 8,106,460 B2 | 1/2012 | Yajima | |
| 9,111,810 B2* | 8/2015 | Kitagawa | H01L 27/1225 |
| 2004/0173867 A1* | 9/2004 | Beigel | H01L 27/0629 |
| | | | 257/500 |
| 2008/0179630 A1* | 7/2008 | Atherton | H01L 27/0255 |
| | | | 257/192 |

* cited by examiner

SEMICONDUCTOR DEVICE

CROSS-REFERENCE TO RELATED APPLICATION

This application is based upon and claims the benefit of priority from Japanese Patent Application No. 2014-185530, filed Sep. 11, 2014, the entire contents of which are incorporated herein by reference.

FIELD

Embodiments described herein relate to a semiconductor device.

BACKGROUND

As a countermeasure to ESD (Electro Static Discharge) in a semiconductor device, there has been known a technique where a Zener diode which protects a semiconductor element is incorporated into the semiconductor device. However, there exists a possibility that a large electric current flows into the Zener diode thus breaking the Zener diode. There also exists a possibility that some of the electric current is not absorbed by the Zener diode and flows into an element portion of the device, thus breaking the element by heat or overvoltage or overcurrent thereof. To avoid such a situation, there has been proposed a method where a P/N-junction area of the Zener diode is increased so that a dynamic resistance of the Zener diode is lowered.

However, in a situation where a size of a semiconductor device is miniaturized, when a P/N-junction area is simply increased, an element area is decreased thus giving rise to a drawback that the ON resistance of the semiconductor device is increased.

DETAILED DESCRIPTION

Embodiments provide a semiconductor device where ESD resistance is reinforced while an increase of the ON resistance is suppressed.

In general, according to one embodiment, a semiconductor device includes: a first semiconductor region of a first conductive type; a first electrode located below the first semiconductor region; a second semiconductor region of a second conductive type that is selectively located on the first semiconductor region; a third semiconductor region of a first conductive type that is selectively located on the second semiconductor region; a second electrode located in the first semiconductor region, the second semiconductor region and the third semiconductor region through a first insulation film therebetween; a first rectifying element located on the first semiconductor region, through a second insulation film therebetween, in an area where the second semiconductor region, the third semiconductor region, the first insulation film, and the second electrode are not provided, the first rectifying element having a structure where a fourth semiconductor region and a fifth semiconductor region having a conductive type different from the fourth semiconductor region are alternately disposed; a second rectifying element located on the first semiconductor region, through the second insulation film therebetween, in an area where the second semiconductor region, the third semiconductor region, the first insulation film, and the second electrode are not located and the first rectifying element is not provided, the second rectifying element having a structure where a sixth semiconductor region and a seventh semiconductor region having a conductive type different from the sixth semiconductor region are alternately disposed; a third electrode located over the first semiconductor region, is electrically connected to the third semiconductor region, and electrically connected to any portion of the fourth semiconductor regions of the first rectifying element and to any portion of the sixth semiconductor regions of the second rectifying element; and a fourth electrode that is located over the first semiconductor region, is electrically connected to the second electrode, surrounds the third electrode, and is electrically connected to the fourth semiconductor region other than any portions of the fourth semiconductor regions of the first rectifying element and to the sixth semiconductor region other than the any portions of the sixth semiconductor region of the second rectifying element.

Hereinafter, embodiments are explained by reference to drawings. In the explanation made hereinafter, identical parts are given the same symbols, and the repeated explanation of the parts which are explained once is omitted when appropriate.

First Embodiment

Figure 1A:
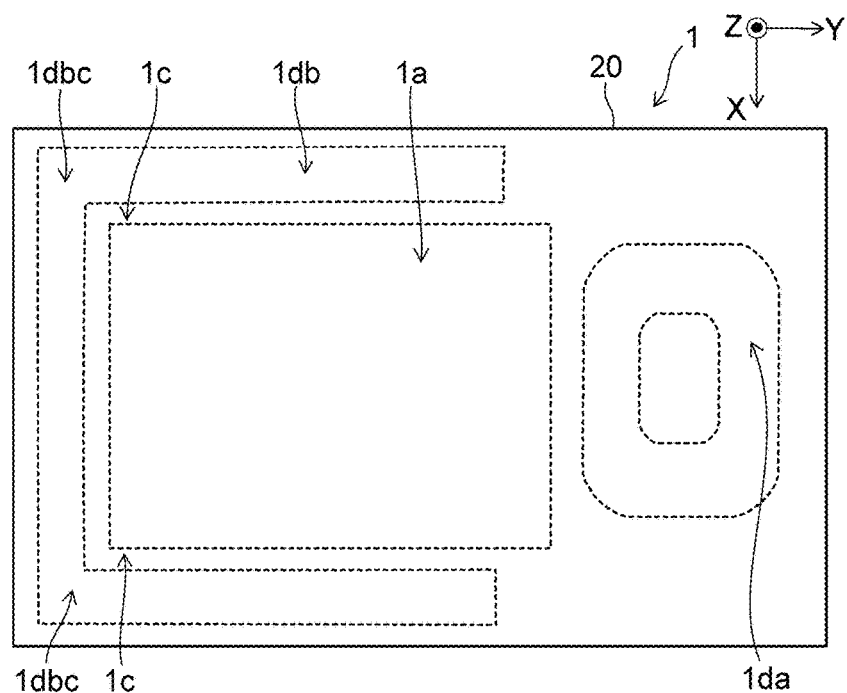
FIG. 1A and FIG. 1B are schematic plan views illustrating a semiconductor device according to a first embodiment.
Figure 1B:
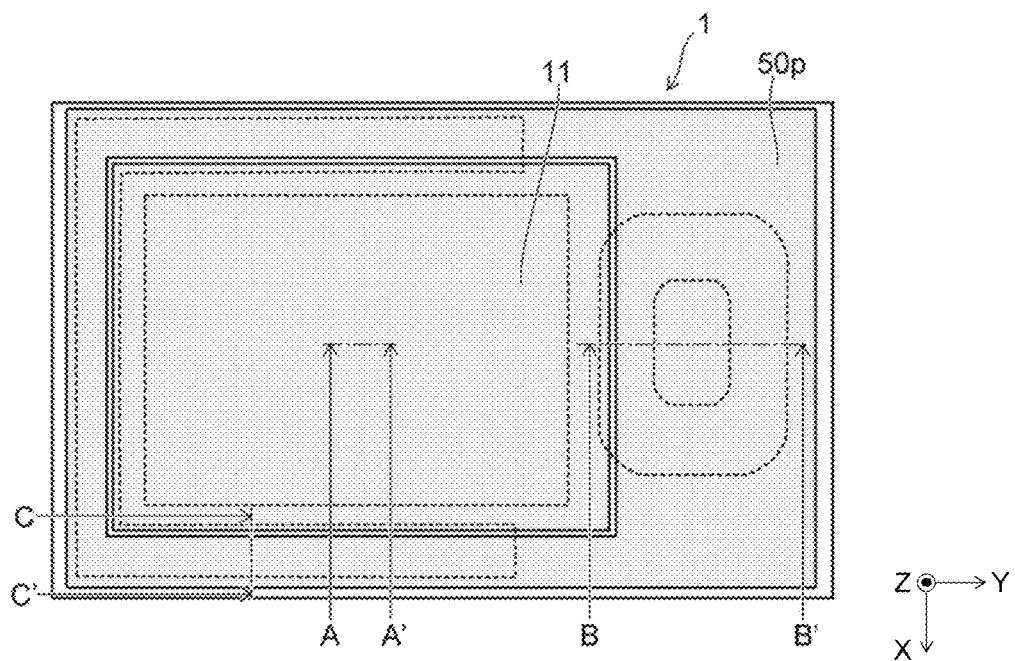

FIG. 1A and FIG. 1B are schematic plan views illustrating a semiconductor device according to a first embodiment.

FIG. 1A illustrates a planar layout of the semiconductor device 1. FIG. 1B illustrates a planar layout of electrodes mounted on an upper surface side of the semiconductor device 1.

As illustrated in FIG. 1A, a first semiconductor region 20 (hereinafter semiconductor region 20, for example) includes: a first region 1a (hereinafter active region 1a, for example); a second region 1da (hereinafter diode region 1da, for example); and a third region 1db (hereinafter diode region 1db, for example). When the semiconductor device 1 is viewed along the Z direction, the diode region 1da is disposed side by side with the active region 1a. Viewing the semiconductor device 1 in the Z direction is referred to as "as viewed in a plan view". The diode region 1db is disposed along the active region 1a. The active region 1a includes at least one corner portion 1c. The diode region 1db includes regions 1*dbc* which are bent along the corner portions 1*c*. The semiconductor region 20 is used in common by the active region 1*a*, the diode region 1*da*, and diode region 1*db*.

As illustrated in FIG. 1B, a third electrode (hereinafter electrode 11, for example) is mounted on an upper side of the active region 1*a*, an upper side of a portion of the diode region 1*da*, and an upper side of a portion of the diode region 1*db*. The electrode 11 is also referred to as "source electrode 11". An electrode 50*p* is disposed around the electrode 11. The electrode 50*p* is also referred to as "gate pad 50*p*". The electrode 50*p* surrounds the electrode 11.

The active region 1*a* is explained.

Figure 2:
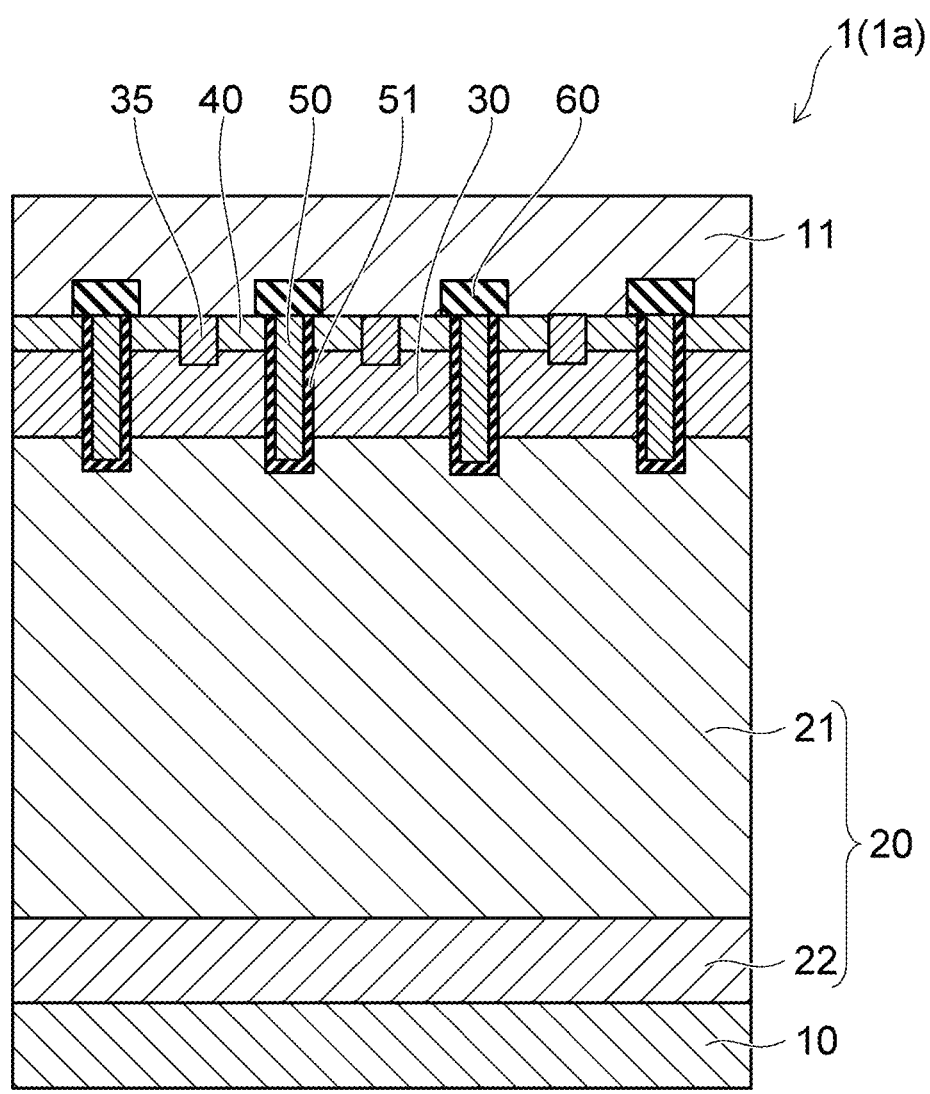
FIG. 2 is a schematic cross-sectional view taken along a line A-A' of the semiconductor device according to the first embodiment illustrated in FIG. 1B.

FIG. 2 is a schematic cross-sectional view taken along a line A-A' of the semiconductor device according to the first embodiment illustrated in FIG. 1B.

A MOSFET (Metal Oxide Semiconductor Field Effect Transistor) having the vertical electrode structure is provided in the active region 1*a*.

For example, in the active region 1*a*, a first electrode 10 (hereinafter electrode 10, for example) is formed below the semiconductor region 20. A semiconductor region 22 in the semiconductor region 20 is electrically connected to the electrode 10. The electrode 10 is also referred to as "drain electrode 10". The semiconductor region 22 is also referred to as "drain region 22". An n-type semiconductor region 21 is formed on the semiconductor region 22. A dopant concentration in the semiconductor region 21 is lower than a dopant concentration in the semiconductor region 22. The semiconductor region 21 is also referred to as "drift region 21". Assume that the semiconductor region 20 is formed of the semiconductor region 22 and the semiconductor region 21.

A p-type second semiconductor region 30 (hereinafter semiconductor region 30, for example) is selectively provided on the semiconductor region 20. The semiconductor region 30 is also referred to as "base region 30". An n$^+$ type third semiconductor region 40 (hereinafter semiconductor region 40, for example) is selectively located on the semiconductor region 30. The semiconductor region 40 is also referred to as "source region 40". A dopant concentration in the semiconductor region 40 is higher than a dopant concentration in the semiconductor region 21. P$^+$ type semiconductor regions 35 are formed on the semiconductor region 30. A dopant concentration in the semiconductor region 35 is higher than a dopant concentration in the semiconductor region 30.

Second electrodes 50 (hereinafter electrodes 50, for example) are formed on the semiconductor region 20, the semiconductor region 30, and the semiconductor region 40 with a first insulation film 51 (hereinafter insulation film 51, for example) interposed therebetween. The electrode 50 is also referred to as "gate electrode 50". The insulation film 51 is also referred to as "gate insulation film 51". The electrode 11 is electrically connected to the semiconductor region 40 and the semiconductor regions 35. The electrode 11 is located on an upper side of the semiconductor region 20 disposed in the active region 1*a*. The electrode 50 is electrically connected to the electrode 50*p* through wiring (not illustrated in the drawing). The electrode 50*p* is mounted on the upper side of the semiconductor region 20 in the diode regions 1*da*, 1*db* (FIG. 3A). Interlayer insulation films 60 are disposed between the electrode 11 and the electrodes 50 and the insulation films 51.

In the active region 1*a*, a channel is formed in the semiconductor region 30 when the semiconductor device 1 is in an ON state so that an electric current flows between the electrode 11 and the electrode 10.

Although the n type MOSFET is explained as one example, a p type MOSFET may be used. Even when the p type MOSFET is used, substantially the same advantageous effect may be acquired as in the case where the n type MOSFET is used.

Figure 3:
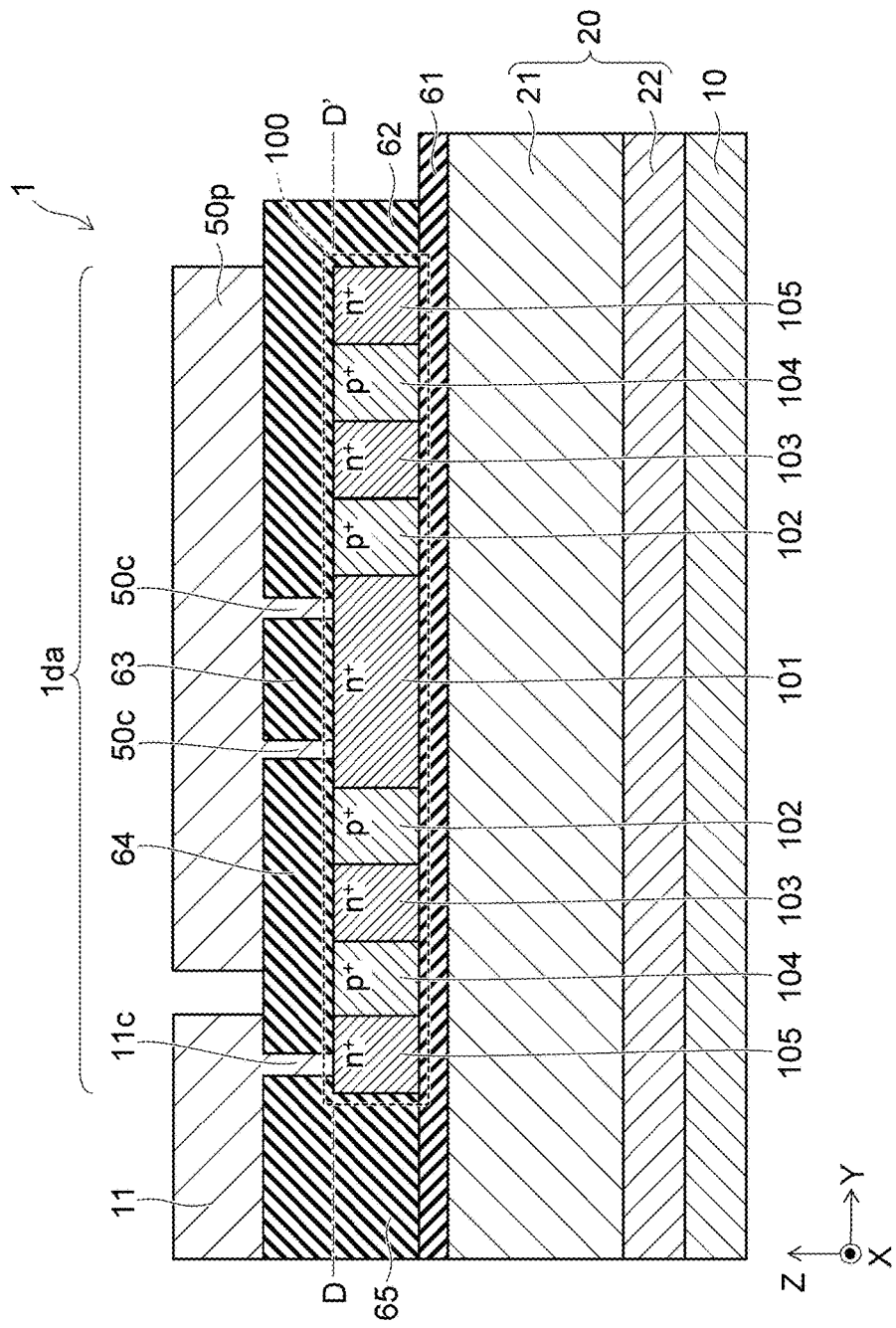
FIG. 3 is a schematic cross-sectional view taken along a line B-B' of the semiconductor device according to the first embodiment illustrated in FIG. 1B.

The diode regions 1*da*, 1*db* are now explained. FIG. 3 is a schematic cross-sectional view taken along a line B-B' of the semiconductor device according to the first embodiment illustrated in FIG. 1B.

Figure 4:
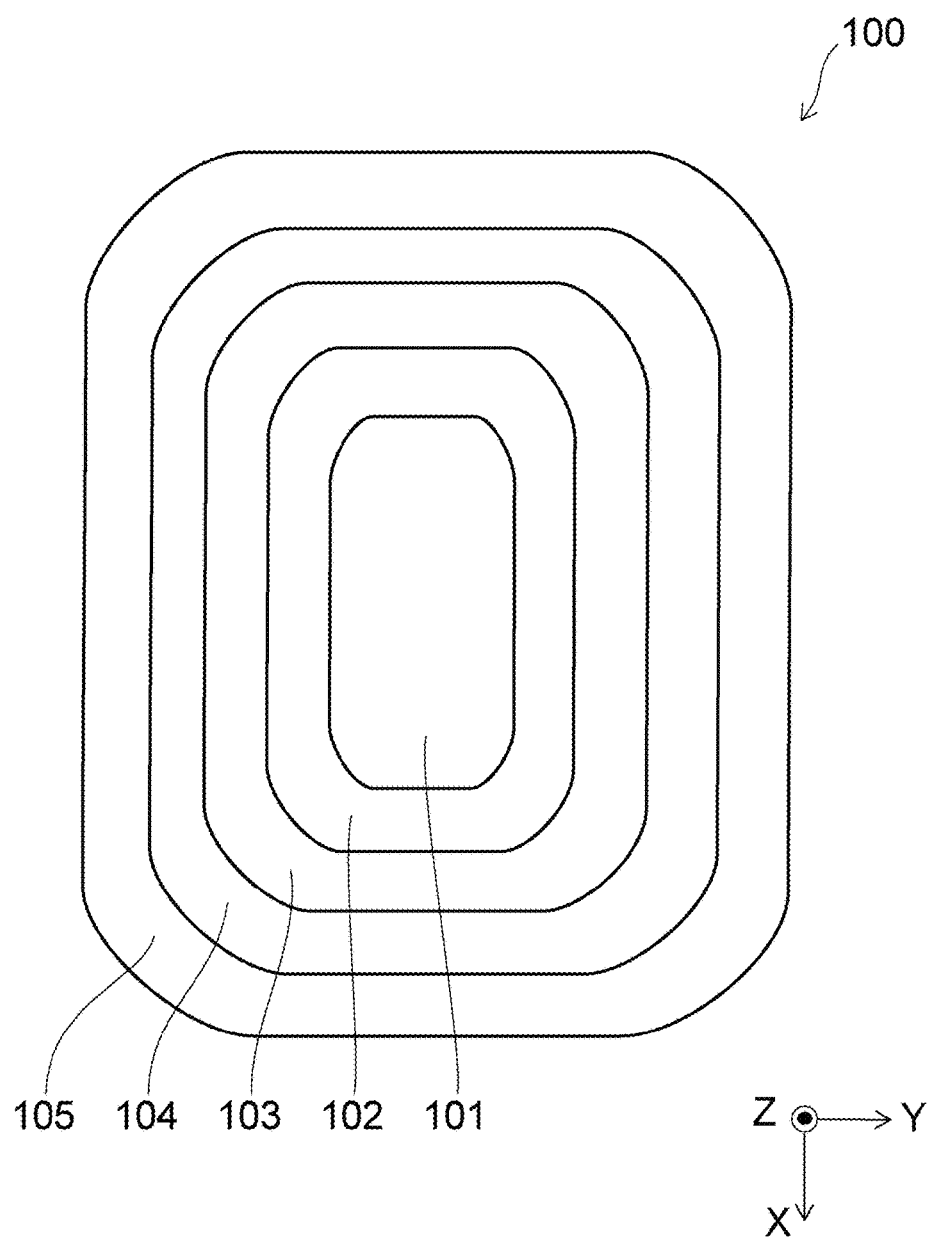
FIG. 4 is a schematic plan view illustrating the semiconductor device according to the first embodiment.

FIG. 4 is a schematic plan view illustrating the semiconductor device according to the first embodiment.

FIG. 3 illustrates a cross section taken along a line B-B' of an area other than the diode region 1*da* but in the vicinity of the diode region 1*da* illustrated in FIG. 1B.

FIG. 4 is a view of a first rectifying element 100 (hereinafter rectifying element 100, for example) as viewed in the Z direction at a position indicated by a line D-D' in FIG. 3. As viewed in a plan view, the rectifying element 100 is disposed side by side with the active region 1*a*. The rectifying element 100 is disposed on the semiconductor region 20 in an area different from an area where the semiconductor region 30, the semiconductor region 40, the insulation films 51, and the electrodes 50 are formed. The rectifying element 100 is disposed side by side with the area where the semiconductor region 30, the semiconductor region 40, the insulation films 51, and the electrodes 50 are disposed.

In the semiconductor device 1, the rectifying element 100 is formed on the semiconductor region 20 in the diode region 1*da* with a second insulation film 61 (hereinafter insulation film 61, for example) interposed therebetween (FIG. 3). That is, the rectifying element 100 is formed on the semiconductor region 20 in an area where the second semiconductor region 30 is not formed with the insulation film 61 interposed therebetween. In this embodiment, the rectifying element 100 is a bidirectional Zener diode where a p$^+$ type semiconductor region and an n$^+$ type semiconductor regions are alternately disposed.

In the rectifying element 100, a p$^+$ type semiconductor region 102 is disposed around an n$^+$ type semiconductor region 101. An n$^+$ type semiconductor region 103 is disposed around the p$^+$ type semiconductor region 102. A p$^+$ type semiconductor region 104 is disposed around the n$^+$ type semiconductor region 103. An n$^+$ type semiconductor region 105 is disposed around the p$^+$ type semiconductor region 104 (FIG. 4).

Further, the semiconductor regions 102 to 105 are disposed in an annular shape surrounding a semiconductor region. By disposing the semiconductor regions 102 to 105 in an annular shape, a P/N-junction area in the rectifying element 100 is increased.

Further, by disposing the semiconductor regions 102 to 105 in an annular shape, the presence of ends thereof is eliminated from the semiconductor regions 102 to 105. When ends exist in the semiconductor regions 102 to 105, an electric field concentrates on corner portions of the ends so that there exists a possibility that the rectifying element may break down. On the other hand, the semiconductor regions 102 to 105 have no such terminals end and hence, the breaking down of the rectifying element may be avoided.

Assume that the n$^+$ type semiconductor regions 101, 103, 105 form fourth semiconductor regions respectively, and the p$^+$ type semiconductor regions 102, 104 form fifth semiconductor regions respectively. In this case, the rectifying element 100 has the structure where the n$^+$ type fourth semiconductor region and the p$^+$ type fifth semiconductor region which has a conductive type different from the conductive type of the fourth semiconductor region are alternately disposed.

For example, when a Zener diode having the structure of $n^+$ type/$p^+$ type/$n^+$ type/$p^+$ type/$n^+$ type is used, the electrode 11 is electrically connected to any one of fourth semiconductor regions of the rectifying element 100 through a contact region 11c. The electrode 50p is electrically connected to the fourth semiconductor regions of the rectifying element 100 other than any one of the above-mentioned fourth semiconductor region through contact regions 50c.

For example, out of the $n^+$ type semiconductor regions 101, 103, 105, the semiconductor region 105 is electrically connected to the electrode 11 through the contact region 11c. Further, out of the $n^+$ type semiconductor regions other than the semiconductor region 105, that is, out of the semiconductor regions 101, 103, the semiconductor region 101 is electrically connected to the electrode 50p through the contact regions 50c.

Interlayer insulation films 62, 63, 64 are formed between the rectifying element 100 and the electrode 50p. The interlayer insulation films 64, 65 are formed between the rectifying element 100 and the electrode 11. In the rectifying element 100, the number of $p^+$ type semiconductor regions and the number of $n^+$ type semiconductor regions are not limited to the numbers illustrated in the drawing.

Further, although the Zener diode having the structure of $n^+$ type/$p^+$ type/$n^+$ type/$p^+$ type/$n^+$ type is exemplified in FIG. 3 and FIG. 4, a Zener diode having the structure of $p^+$ type/$n^+$ type/$p^+$ type/$n^+$ type/$p^+$ type may be used.

Figure 5:
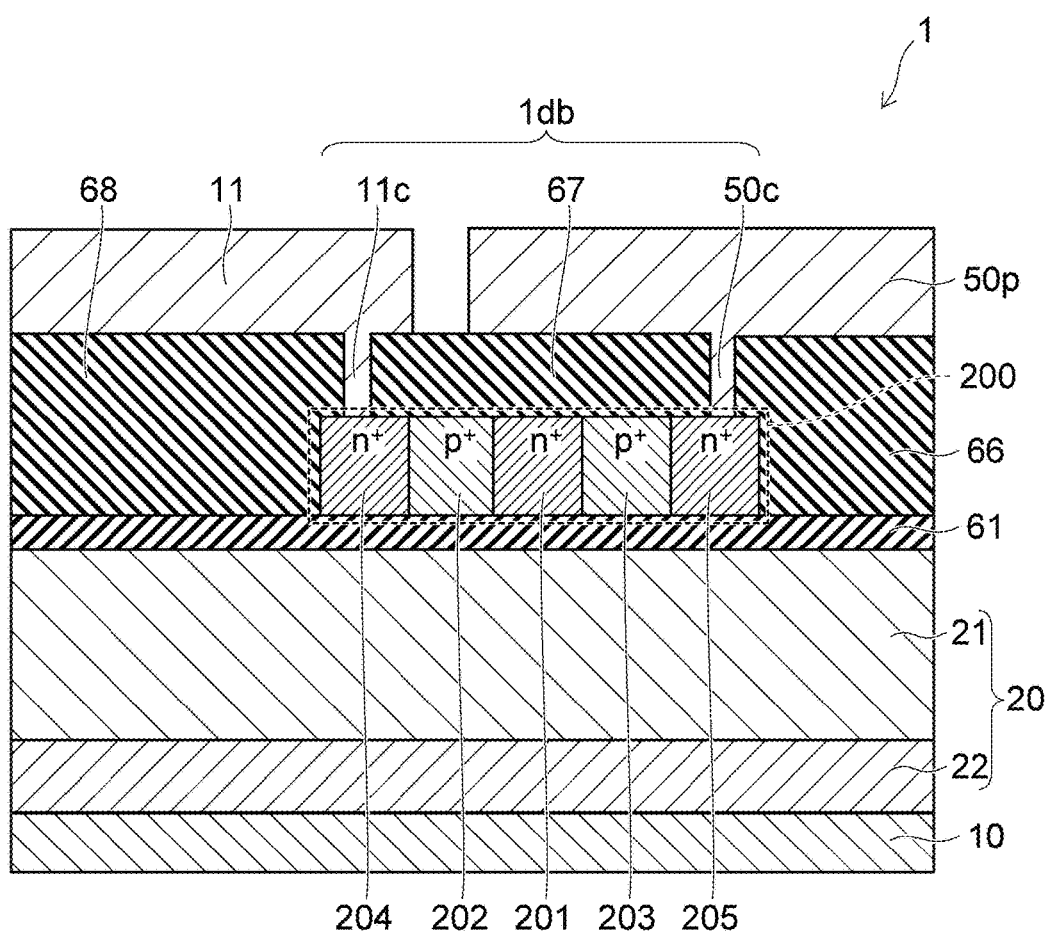
FIG. 5 is a schematic cross-sectional view taken along a line C-C' of the semiconductor device according to the first embodiment illustrated in FIG. 1B.

FIG. 5 is a schematic cross-sectional view taken along a line C-C' of the semiconductor device according to the first embodiment illustrated in FIG. 1B.

Figure 6:
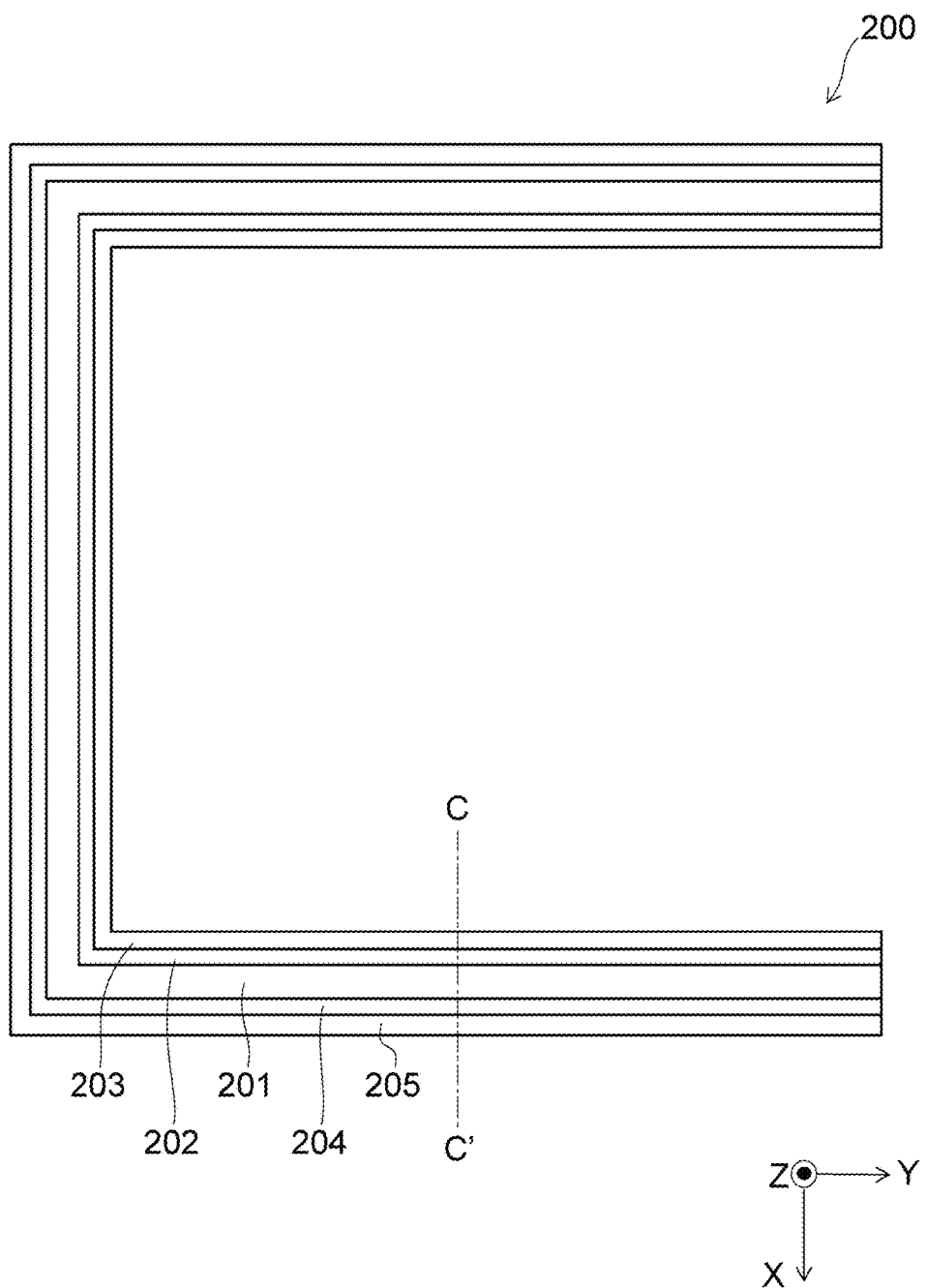
FIG. 6 is a schematic plan view illustrating the semiconductor device according to the first embodiment.

FIG. 6 is a schematic plan view illustrating the semiconductor device according to the first embodiment.

FIG. 5 illustrates a cross section taken along a line C-C' of an area other than the diode region 1db and an area in the vicinity of the diode region 1db illustrated in FIG. 1B.

FIG. 6 is a view of a second rectifying element 200 (hereinafter rectifying element 200, for example) formed in the diode region 1db as viewed in the Z direction. In this embodiment, the rectifying element 200 configures a bidirectional Zener diode where a $p^+$ type semiconductor region and an $n^+$ type semiconductor region are alternately disposed. As viewed in a plan view, the rectifying element 200 is disposed along the active region 1a. The rectifying element 200 is disposed on the semiconductor region 20 in areas other than an area where the active region 1a is disposed and the region where the rectifying element 100 is disposed. The rectifying element 200 is disposed so as to extend along the area where the semiconductor region 30, the semiconductor region 40, the insulation films 51, and the electrodes 50 are disposed. The rectifying element 200 also has a region which is bent along the corner portions 1c of the active region 1a.

In the semiconductor device 1, the rectifying element 200 is provided on the semiconductor region 20 in the diode region 1db with the insulation film 61 interposed therebetween (FIG. 5). That is, the rectifying element 200 is provided on the semiconductor region 20 in an area where neither the semiconductor region 30 nor the rectifying element 100 is formed with the insulation film 61 interposed therebetween.

In the rectifying element 200, a $p^+$ type semiconductor region 202 and a $p^+$ type semiconductor region 203 are disposed on both sides of an $n^+$ type semiconductor region 201 respectively. The $p^+$ type semiconductor region 202 is interposed between the $n^+$ type semiconductor region 201 and an $n^+$ type semiconductor region 204. The $p^+$ type semiconductor region 203 is interposed between the $n^+$ type semiconductor region 201 and an $n^+$ type semiconductor region 205 (FIG. 6).

Assume that the $n^+$ type semiconductor regions 201, 204, 205 form sixth semiconductor regions respectively, and the $p^+$ type semiconductor regions 202, 203 form seventh semiconductor regions respectively. In this case, the rectifying element 200 has the structure where the $n^+$ type sixth semiconductor region and the $p^+$ type seventh semiconductor region having a conductive type different from the conductive type of the sixth semiconductor region are alternately disposed. The semiconductor regions 201, 204, 205 and the semiconductor regions 202, 203 are also disposed along the active region 1a.

For example, when a Zener diode having the structure of $n^+$ type/$p^+$ type/$n^+$ type/$p^+$ type/$n^+$ type is used, the electrode is electrically connected to any one of the sixth semiconductor regions of the rectifying element 200 through the contact region 11c. The electrode 50p is electrically connected to the sixth semiconductor region of the rectifying element 200 other than any one of the above-mentioned sixth semiconductor regions through the contact region 50c.

For example, out of the $n^+$ type semiconductor regions 201, 204, 205, the semiconductor region 204 is electrically connected to the electrode 11 through the contact region 11c. Further, out of $n^+$ type semiconductor regions other than the semiconductor region 204, that is, of the semiconductor regions 201, 205, the semiconductor region 205 is electrically connected to the electrode 50p through the contact region 50c.

Interlayer insulation films 66, 67 are formed between the rectifying element 200 and the electrode 50p. Interlayer insulation films 67, 68 are provided between the rectifying element 200 and the electrode 11. In the rectifying element 200, the number of $p^+$ type semiconductor regions and the number of $n^+$ type semiconductor regions are not limited to the numbers illustrated in the drawing.

Further, although the Zener diode having the structure of $n^+$ type/$p^+$ type/$n^+$ type/$p^+$ type/$n^+$ type is exemplified in FIG. 5 and FIG. 6, a Zener diode having the structure of $p^+$ type/$n^+$ type/$p^+$ type/$n^+$ type/$p^+$ type may be used (described later).

A material for forming the semiconductor regions according to the embodiment is silicon (Si), silicon carbide (SiC), gallium arsenide (GaAs) or the like, for example. A material for forming the electrodes 10, 11, 50p, and a material for forming the contact regions are at least any one of metals selected from a group including aluminum (Al), nickel (Ni), copper (Cu), titanium (Ti), for example. A material for forming the electrode 50 may be a semiconductor into which a dopant element is introduced (poly-silicon, for example), or metal (tungsten, for example). Further, a material for forming the "insulation film" according to the embodiment may also be silicon dioxide (SiOx), silicon nitride (SiNx) or the like.

In the embodiment, "$n^+$ type" and "n type" may be referred to as "first conductive type", and "$p^+$ type" and "p type" may be referred to as "second conductive type". Further, a dopant concentration is lowered in the order of "$n^+$ type" and "n type", and a dopant concentration is lowered in the order of "$p^+$ type" and "p type".

Phosphorus (P), arsenic (As) or the like may an $n^+$ type dopant element or an n type dopant element, for example. Boron (B) or the like may be a $p^+$ type dopant element or a p type dopant element.

Figure 7A:
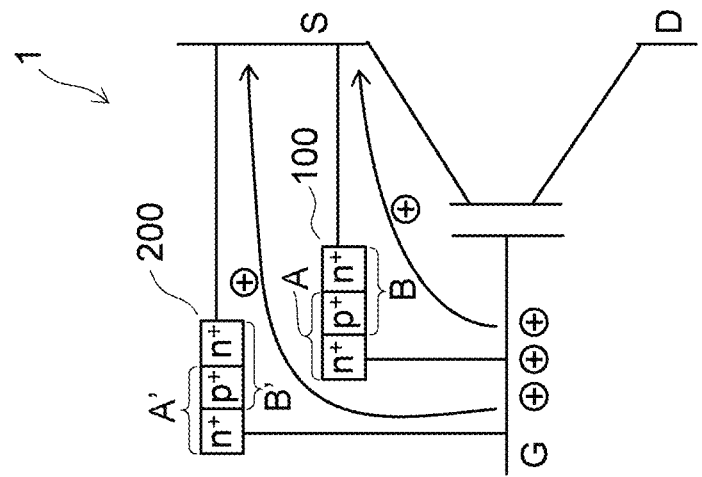
FIG. 7A to FIG. 7C are schematic views illustrating the manner of operation of the semiconductor device according to the first embodiment.
Figure 7B:
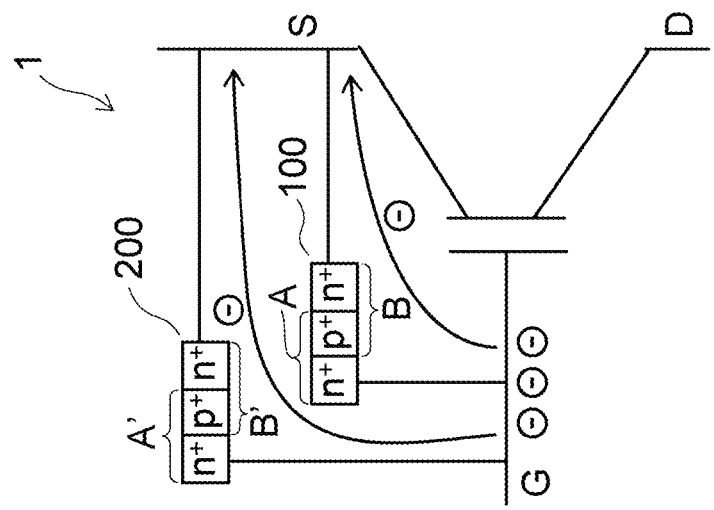
Figure 7C:
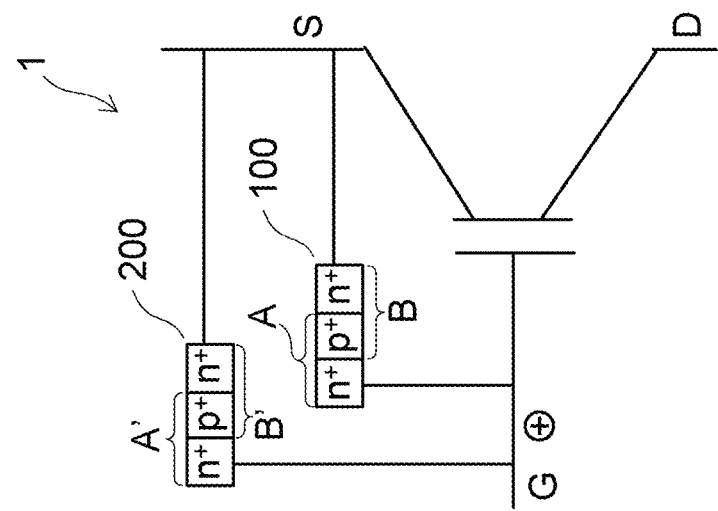

FIG. 7A to FIG. 7C are schematic views illustrating the manner of operation of the semiconductor device according to the first embodiment.

A gate pad 50p (G), a source electrode 11 (S), and a drain electrode 10 (D) are schematically illustrated in FIG. 7A to FIG. 7C. In the semiconductor device 1, the gate pad 50p (G+) and the source electrode 11 (node S) are connected to each other through the rectifying element 100. Further, in the semiconductor device 1, the gate pad 50p and the source electrode 11 are connected to each other through the rectifying element 200. That is, the plurality of rectifying elements 100, 200 are connected in parallel between the gate pad 50p and the source electrode 11.

In FIG. 7A to FIG. 7C, the rectifying element 100 formed of an $n^+$ type semiconductor region, a $p^+$ type semiconductor region and an $n^+$ type semiconductor region, and the rectifying element 200 formed of an $n^+$ type semiconductor region, a $p^+$ type semiconductor region and an $n^+$ type semiconductor region are exemplified. In this embodiment, the rectifying element 100 includes a diode A and a diode B. The rectifying element 200 includes a diode A' and a diode B'. The diodes A, B, A', B' are respectively formed as a Zener diode.

In operating the semiconductor device 1, a ground potential is applied to the source electrode 11, and a predetermined potential is applied to the drain electrode 10 (Node D). Then, when the MOSFET is turned on, a potential equal to or more than a threshold potential (Vth) is applied to the gate electrode 50. As illustrated in FIG. 7A, the potential equal to or more than a threshold potential is a positive potential, for example. In this embodiment, the MOSFET is an n type MOSFET.

When the semiconductor device 1 is in an ON state, a potential of the gate pad 50p is several (V) to several tens (V) compared to a potential of the source electrode 11. In this case, a reverse bias is applied to the diode A of the rectifying element 100. A reverse bias is also applied to the diode A' of the rectifying element 200. Accordingly, an electric current does not flow between the gate pad 50p and the source electrode 11. That is, the gate pad 50p and the source electrode 11 are insulated from each other.

When the semiconductor device 1 is in an OFF state, a potential of the gate pad 50p is substantially equal to a potential of the source electrode 11, for example. Accordingly, an electric current does not flow between the gate pad 50p and the source electrode 11.

The semiconductor device 1 is turned on or turned off in this manner.

On the other hand, as illustrated in FIG. 7B, when an excessively large negative potential such as a surge voltage is applied to the gate pad 50p due to static electricity or the like, for example, a forward bias is applied to the diode A, and a reverse bias equal to or lower than a breakdown voltage of a Zener diode is applied to the diode B. At this stage of operation, a forward bias is also applied to the diode A', and a reverse bias equal to or lower than a breakdown voltage of the Zener diode is applied to the diode B'. Accordingly, a negative charge supplied to the gate pad 50p is rapidly discharged to the source electrode 11 through the rectifying elements 100, 200. That is, the negative charge flows through the diode to which the forward bias is applied and, thereafter, forms a leakage current in the Zener diode to which the reverse bias equal to or lower than the breakdown voltage is applied, and a leakage current is discharged to the source electrode 11.

Further, as illustrated in FIG. 7C, when an excessively large positive potential such as a surge voltage is applied to the gate pad 50p, for example, a forward bias is applied to the diode B, and a reverse bias equal to or lower than a breakdown voltage of a Zener diode is applied to the diode A. At this stage of operation, a forward bias is applied to the diode B', and a reverse bias equal to or lower than the breakdown voltage of the Zener diode is applied to the diode A'. Accordingly, a positive charge supplied to the gate pad 50p is rapidly discharged to the source electrode 11 through the rectifying elements 100, 200. That is, the positive charge flows through the Zener diode to which the reverse bias equal to or lower than a breakdown voltage is applied and, thereafter, is discharged to the source electrode 11 through the diode to which the forward bias is applied.

In FIG. 7A to FIG. 7C, a Zener diode formed of an $n^+$ type semiconductor region, a $p^+$ type semiconductor region and an $n^+$ type semiconductor region is exemplified. However, even when a Zener diode formed of a $p^+$ type semiconductor region, an $n^+$ type semiconductor region and a $p^+$ type semiconductor region is used, a negative charge and a positive charge supplied to the gate pad 50p may be rapidly discharged to the source electrode 11.

As a countermeasure to cope with ESD in a semiconductor device, there has been known a method where an ability of a Zener diode per se is enhanced by increasing a P/N-junction area in the Zener diode. However, in the miniaturization of the semiconductor device, this method decreases an area which an active region can occupy. In this case, there arises a possibility that an ON resistance of the semiconductor device is increased.

To the contrary, in the first embodiment, without substantially changing the size of the area which the active region 1a occupies, the rectifying element 200 is disposed along the active region 1a in addition to the rectifying element 100. That is, instead of leaving the position disposed along the active region 1a as an unused region, the rectifying element 200 is disposed at such a position.

Accordingly, without substantially changing an area which the active region 1a occupies, the plurality of rectifying elements 100, 200 may be connected in parallel between the electrode 11 and the electrode 50p. Further, in the rectifying element 200, the semiconductor regions 201 to 205 of the rectifying element 200 may be disposed along the active region 1a and hence, a P/N-junction area is increased.

Due to such a configuration, an ON resistance of the semiconductor device is not increased and hence, it is possible to make a Zener current flow into the plurality of rectifying elements 100, 200 in a dispersed manner. Further, the P/N-junction area in the rectifying elements 100, 200 is large and hence, the rectifying elements 100, 200 have high resistance.

In this manner, the gate pad 50p is protected from an overvoltage in the semiconductor device 1. That is, even when the semiconductor device 1 is placed in an environment where an overvoltage is applied to the gate pad 50p, the semiconductor device 1 may be turned on or turned off in a stable manner.

Further, in the semiconductor device 1, the semiconductor region 101 positioned at the center of the rectifying element 100 is used as a portion of the Zener diode, and is not an unused region. Further, an area sufficient for allowing the bonding of a bonding wire to the electrode 50p (gate pad 50p) on the diode region 1db is ensured.

As a means for protecting the gate pad 50p from an overvoltage, a method which provides a control circuit where an overvoltage is not applied to a gate electrode, and a method of increasing dielectric strength of the semiconductor device per se are considered.

However, the method which increases the number of control circuits pushes up a manufacturing cost. Further, when the number of control circuits is increased, there may be a case where the size of the device becomes large. The method of increasing dielectric strength of the semiconductor device may require a large change in size or a large change in material. The first embodiment does not require such a change in number of control circuits, a change in size of the device, and a change in material.

With respect to the above-mentioned manner of operation, the example where the Zener diode having the structure of $n^+$ type/$p^+$ type/$n^+$ type/$p^+$ type/$n^+$ type is used is described. However, a Zener diode having the structure of $p^+$ type/$n^+$ type/$p^+$ type/$n^+$ type/$p^+$ type may be used.

That is, in this case, the electrode 10 is formed on the upper side of the semiconductor region 20 and is electrically connected to the semiconductor region 40. The electrode 10 is electrically connected to any one of the fourth semiconductor regions of the rectifying element 100, and to any one of sixth semiconductor regions of the rectifying element 200.

The fourth electrode 50p is formed on the upper side of the semiconductor region 20, and is electrically connected to the second electrode 50. The fourth electrode 50p surrounds the third electrode 11. The fourth electrode 50p is electrically connected to the fourth semiconductor regions of the rectifying element 100 other than the above-mentioned fourth semiconductor region, and to the sixth semiconductor regions of the rectifying element 200 other than the above-mentioned sixth semiconductor region.

In this embodiment, when a Zener diode having the structure of $n^+$ type/$p^+$ type/$n^+$ type/$p^+$ type/$n^+$ type is used, as a conductive type of the fourth semiconductor region and a conductive type of the sixth semiconductor region, an $n^+$ type is used, while as a conductive type of the fifth semiconductor region and a conductive type of the seventh semiconductor region, a $p^+$ type is used. On the other hand, when a Zener diode having the structure of $p^+$ type/$n^+$ type/$p^+$ type/$n^+$ type/$p^+$ type is used, as a conductive type of the fourth semiconductor region and a conductive type of the sixth semiconductor region, a $p^+$ type is used, while as a conductive type of the fifth semiconductor region and a conductive type of the seventh semiconductor region, an $n^+$ type is used.

Second Embodiment

Figure 8A:
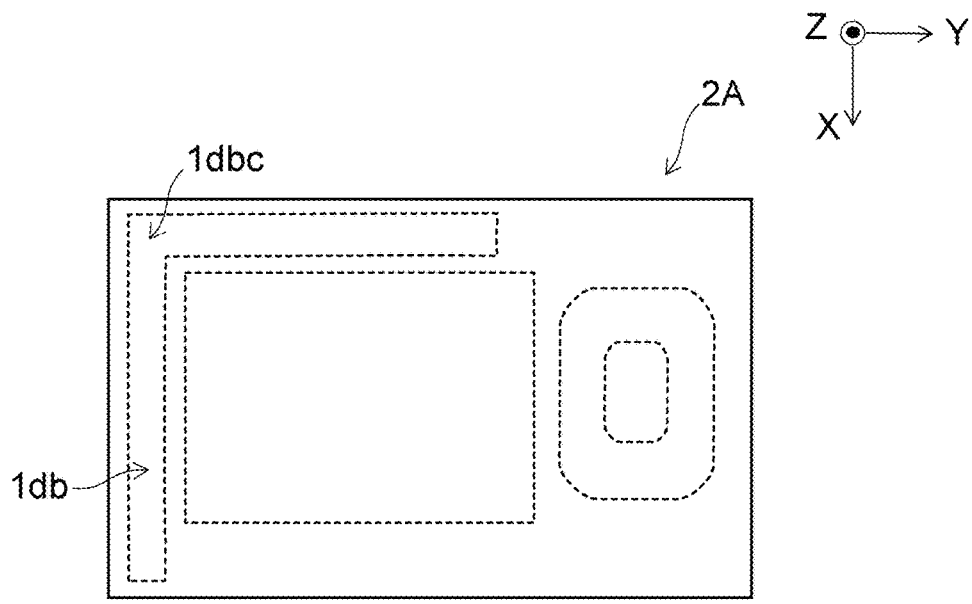
FIG. 8A is a schematic plan view illustrating a semiconductor device of a first example of a second embodiment.
Figure 8B:
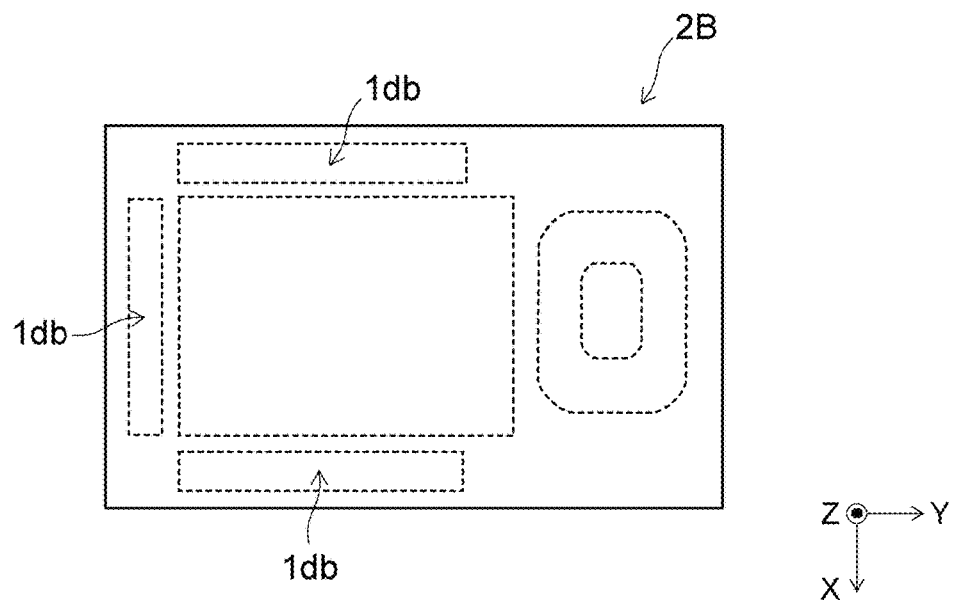
FIG. 8B is a schematic plan view illustrating a semiconductor device of a second example of the second embodiment.

FIG. 8A is a schematic plan view illustrating a semiconductor device according to a first example of a second embodiment, and FIG. 8B is a schematic plan view illustrating a semiconductor device according to a second example of the second embodiment.

In a diode region 1db, the number of regions 1dbc may be one as in the case of a semiconductor device 2A illustrated in FIG. 8A. Further, the diode region 1db may be divided into a plurality of sections as in the case of a semiconductor device 2B illustrated in FIG. 8B. Even when the diode region is disposed in such a manner, such disposition may acquire the advantageous effects substantially equal to the advantageous effects of the first embodiment.

The embodiments of the present disclosure have been explained by reference to the specific examples heretofore. However, the embodiments of the present disclosure are not limited to these specific examples. That is, examples which are prepared by adding suitable design changes to these specific examples by those who are skilled in the art maybe also embraced in the category of the embodiments of the present disclosure provided that these examples also include the technical features of the embodiments. The structural elements which the above-mentioned respective specific examples include, and the dispositions, the materials, the conditions, the shapes, the sized and the like of these structural elements are not limited to, the exemplified values and may be suitably changed.

Further, the respective structural elements which the above-mentioned respective embodiments include maybe combined with each other provided that such combinations are technically feasible, and these combinations are also included in the category of the embodiments of the present disclosure provided that these combinations also include the technical features of the embodiments of the present disclosure. Still further, various variations and modifications are conceivable to those who are skilled in the art within a category of the technical concept of the embodiments of the present disclosure, and it is construed that these variations and modifications also fall within the scope of the present disclosure.

While certain embodiments have been described, these embodiments have been presented byway of example only, and are not intended to limit the scope of the inventions. Indeed, the novel embodiments described herein maybe embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An integrated circuit, comprising;
    an element region between a first electrode and a third electrode in a first direction;
    a second electrode electrically connected to an element in the element region;
    a first diode adjacent to the element region and including a first semiconductor region of a first conductivity type and a second semiconductor region of a second conductivity type adjacent to the first semiconductor region in a second direction crossing the first direction, the first diode electrically connected to the second and third electrodes; and
    a second diode adjacent to the element region and including a third semiconductor region of the first conductivity type and a fourth semiconductor region of the second conductivity type, the second diode electrically connected to the second and third electrodes, wherein the element region is disposed between at least a portion of the first diode and the second diode in the second direction, and the second electrode includes a first portion disposed outside the element region.

2. The integrated circuit of claim 1, wherein the second semiconductor region surrounds the first semiconductor region, and a third semiconductor region surrounds the second semiconductor region.

3. The integrated circuit of claim 2, wherein the first diode and the second diode are electrically connected between the second electrode and the third electrode.

4. The integrated circuit of claim 3, further comprising:
    a fourth semiconductor region of the first conductivity type disposed on the first electrode;
    a fifth semiconductor region of the second conductivity type disposed on the fourth semiconductor region; and
    a sixth semiconductor region of the first conductivity type, wherein a second portion of the second electrode extends through the fifth and sixth semiconductor regions, and terminates inwardly of the fourth semiconductor region.

5. The integrated circuit of claim 4, further comprising an insulating layer disposed between the second electrode and the fourth, fifth and sixth semiconductor regions.

6. The integrated circuit of claim 5, wherein, in the on state of the device, the fifth semiconductor region forms a channel region.

7. The integrated circuit of claim 2, wherein the second diode extends along at least two sides of the element region.

8. The integrated circuit of claim 2, wherein the second diode extends along at least three sides of the element region.

* * * * *